(12) United States Patent
Kaneda et al.

(10) Patent No.: US 9,899,570 B2
(45) Date of Patent: Feb. 20, 2018

(54) SEMICONDUCTOR MULTILAYER STRUCTURE AND METHOD OF MANUFACTURING THE SAME

(71) Applicant: SUMITOMO CHEMICAL COMPANY, LIMITED, Tokyo (JP)

(72) Inventors: Naoki Kaneda, Tokyo (JP); Tomoyoshi Mishima, Tokyo (JP); Tohru Nakamura, Tokyo (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/317,838

(22) PCT Filed: Jun. 5, 2015

(86) PCT No.: PCT/JP2015/066313
§ 371 (c)(1),
(2) Date: Dec. 9, 2016

(87) PCT Pub. No.: WO2015/190406
PCT Pub. Date: Dec. 17, 2015

(65) Prior Publication Data
US 2017/0141270 A1 May 18, 2017

(30) Foreign Application Priority Data

Jun. 10, 2014 (JP) .................. 2014-119819

(51) Int. Cl.
*H01L 33/32* (2010.01)
*H01L 33/02* (2010.01)
*H01L 33/00* (2010.01)

(52) U.S. Cl.
CPC ........ *H01L 33/325* (2013.01); *H01L 33/0075* (2013.01); *H01L 33/0095* (2013.01); *H01L 33/025* (2013.01)

(58) Field of Classification Search
CPC ............... H01L 33/325; H01L 33/0095; H01L 33/0075; H01L 33/025
See application file for complete search history.

(56) References Cited

U.S. PATENT DOCUMENTS 5,657,335 A * 8/1997 Rubin ................. H01L 21/2233
117/108
2005/0023544 A1* 2/2005 Shibata .................. C30B 25/18
257/94

(Continued)

FOREIGN PATENT DOCUMENTS

EP 1246233 A2 10/2002
JP 2004/128189 a * 4/2004 ............. H01L 33/00

(Continued)

OTHER PUBLICATIONS

International Search Report for PCT/JP2015/066313 (PCT/ISA/210) dated Jul. 21, 2015.

(Continued)

*Primary Examiner* — Roy Potter
*Assistant Examiner* — Paul Patton
(74) *Attorney, Agent, or Firm* — Birch, Stewart, Kolasch & Birch, LLP

(57) ABSTRACT

There is provided a semiconductor multilayer structure, including:
an n-type GaN layer; and a p-type GaN layer which is formed on the n-type GaN layer and into which Mg is ion-implanted, and generating an electroluminescence emission having a peak at a photon energy of 3.0 eV or more, by applying a voltage to a pn-junction formed by the n-type GaN layer and the p-type GaN layer.

12 Claims, 9 Drawing Sheets

(56) References Cited

U.S. PATENT DOCUMENTS

| 2005/0104082 A1 | 5/2005 | Oshima |
| 2006/0043419 A1 | 3/2006 | Tachibana et al. |
| 2010/0148174 A1 | 6/2010 | Nakahata et al. |
| 2014/0070371 A1 | 3/2014 | Tsuchiya et al. |
| 2014/0117376 A1 | 5/2014 | Terano et al. |
| 2015/0179780 A1 | 6/2015 | Terano et al. |

FOREIGN PATENT DOCUMENTS

| JP | 2004-128189 A | 4/2004 |
| JP | 2004-356257 A | 12/2004 |
| JP | 2005-340747 A | 12/2005 |
| JP | 2009-91175 A | 4/2009 |
| JP | 2009-170604 A | 7/2009 |
| JP | 2010-180111 A | 8/2010 |
| JP | 2010-182950 A | 8/2010 |
| JP | 2012-64926 A | 3/2012 |
| JP | 2014-51423 A | 3/2014 |
| JP | 2014-90056 A | 5/2014 |
| JP | 2015-126016 A | 7/2015 |

OTHER PUBLICATIONS

Kalinina et al., "Electrical and optical properties of Mg ion implanted GaN p-n junctions.", HITEN 99, Third European Conference on High Temperature Electronics, Berlin, 1999, pp. 91-94.

English translation of the International Preliminary Report on Patentability and Written Opinion of the International Searching Authority (Form PCT/IB/338, PCT/IB/373 and PCT/ISA/237), dated Dec. 22, 2016, for International Application No. PCT/JP2015/066313.

European Patent Office Communication and extended search report issued in the corresponding European Patent Application No. 15806188.7 dated Oct. 24, 2017.

Japanese Notification of Reasons for Refusal dated Nov. 21, 2017, for corresponding Japanese Application No. 2014-119819, with English translation.

* cited by examiner (A)

(B)

(C)

SEMICONDUCTOR MULTILAYER STRUCTURE AND METHOD OF MANUFACTURING THE SAME

TECHNICAL FIELD

The present invention relates to a semiconductor multilayer structure and a method of manufacturing the same.

DESCRIPTION OF RELATED ART

Gallium nitride (GaN) is expected to be utilized for high frequency and high power devices, etc., because a dielectric breakdown electric field and a saturation drift speed are high compared to other semiconductor materials such as silicon (Si) and gallium arsenide (GaAs), etc.

In order to use such excellent physical properties in a wider field, it is important to develop an impurity doping technique to be performed after crystal growth. Si and O are used for n-type impurity doping of GaN, and various devices are reported, which are manufactured by using an ion implantation method.

On the other hand, documents propose that Mg, Be, and Mg/P, etc., are used for the p-type impurity doping of GaN (for example, see patent document 1 and non-patent document 1). However, an actual formation of a p-type GaN layer by the ion implantation method results in a high resistance of an implanted layer, and an excellent p-type layer cannot be formed.

PRIOR ART DOCUMENT

Patent Document

Patent document 1: Japanese Patent Laid Open Publication No. 2009-91175

Non-Patent Document

Non-patent document 1: E. V. Kalinina et al., Electrical and optical properties of Mg ion implanted GaN pn-junctions, HITEN 99.

SUMMARY OF THE INVENTION

Problem to be Solved by the Invention

An object of the present invention is to provide a new technique of forming a p-type GaN layer by an ion implantation method.

Means for Solving the Problem

According to an aspect of the present invention, there is provided a semiconductor multilayer structure, including:
an n-type GaN layer; and
a p-type GaN layer which is formed on the n-type GaN layer and into which Mg is ion-implanted,
and generating an electroluminescence emission having a peak at a photon energy of 3.0 eV or more, by applying a voltage to a pn-junction formed by the n-type GaN layer and the p-type GaN layer.

Advantage of the Invention

A semiconductor multilayer structure can be obtained, having a p-type GaN layer into which Mg is ion-implanted, and having an excellent pn-junction so as to generate an electroluminescence emission.

DETAILED DESCRIPTION OF THE INVENTION

As described hereafter, inventors of the present invention succeed for the first time in the world in manufacturing a GaN multilayer structure having a pn-junction formed by an n-type gallium nitride (GaN) layer and a p-type GaN layer into which magnesium (Mg) is ion-implanted, and generating an electroluminescence (EL) emission having a peak at a photon energy of 3.0 eV or more.

GaN has a bandgap energy of about 3.4 eV. When an excellent pn-junction is formed by the n-type GaN layer and the p-type GaN layer, and a voltage is applied to cause an EL emission, it is expected that an emission is observed having a peak at a photon energy slightly lower than about 3.4 eV of a bandgap energy, for example the photon energy of 3.0 eV or more. Such an emission is caused by a recombination of a donor-acceptor pair (DAP) for example.

When such EL emission is confirmed, this is also a confirmation of forming an excellent p-type GaN layer. The formation of the p-type GaN layer by ion-implantation of Mg, has been attempted conventionally. However, there is no example of actually manufacturing the GaN multilayer structure capable of generating the abovementioned EL emission. Namely, there is no example of actually forming the excellent p-type GaN layer by Mg ion-implantation.

The inventors of the present invention consider that one of the reasons why such a p-type GaN layer can be formed, is that a GaN layer into which Mg is ion-implanted (GaN layer as a base of the Mg ion-implanted GaN layer) can be formed with an extremely excellent crystallinity. The GaN layer into which Mg is implanted, is the layer epitaxially grown on the growth substrate. Accordingly, it can also be considered that by using a single crystal GaN freestanding substrate having the extremely excellent crystallinity as a growth substrate, such a p-type GaN layer can be formed.

The abovementioned GaN multilayer structure will be described hereafter, as the semiconductor multilayer structure according to an embodiment of the present invention. The characteristics of the semiconductor multilayer structure such as the characteristics of the growth substrate, etc., according to an embodiment, will be described through the formation steps of the semiconductor multilayer structure. In addition, a result of a test (example) will be described as an example of this embodiment. FIG. 1, FIG. 2(A), FIG. 3(A), and FIG. 5(A) are schematic cross-sectional views showing the formation steps of the semiconductor multilayer structure according to this embodiment.

Figure 1:
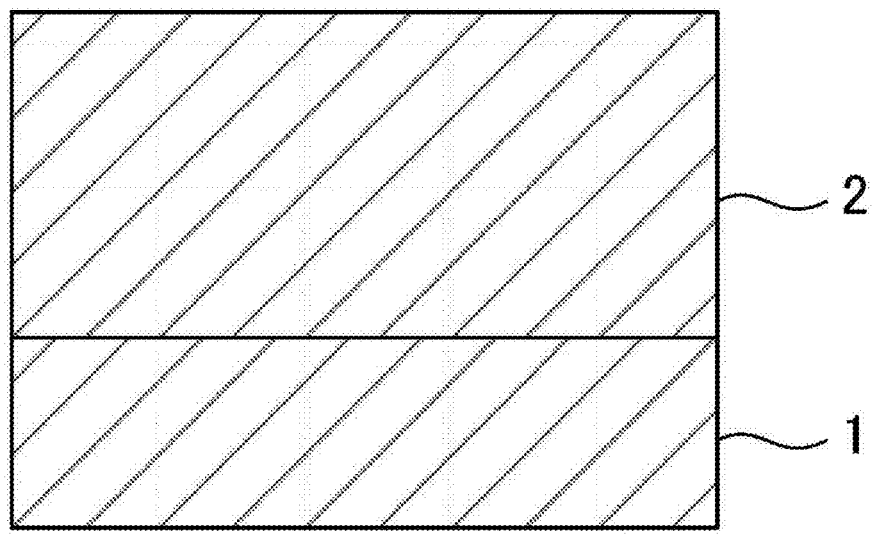
FIG. 1 is a schematic cross-sectional view showing the formation step of a semiconductor multilayer structure according to an embodiment.

FIG. 1 is referenced. GaN substrate 1 is prepared as the growth substrate. The GaN substrate 1 is a freestanding substrate of a single crystal GaN, and can be formed by a Void-Assisted Separation (VAS) method which is one of the techniques using hydride vapor phase epitaxy (HYPE). The GaN substrate 1 is manufactured for example as a wafer having a large area with a diameter of 2 inches. In the example, 1 cm square area cut out from the wafer with a diameter of 2 inches, is used as the GaN substrate 1. Further, in the example, the GaN substrate 1 containing about $2 \times 10^{18}/cm^3$ of silicon (Si) as n-type impurity, and having n-type conductivity with an electron concentration of about $2 \times 10^{18}/cm^3$, was used.

Regarding a certain one GaN substrate, when a measurement is performed to about ten positions by scanning observation areas having a size of a diameter 500 µm per one position in a 3 mm square measurement area, by for example a cathode luminescence (CL) method, it is found that a minimum defect density is for example about $3 \times 10^5/cm^2$, and a maximum defect density is for example about $3 \times 10^6/cm$, an average defect density is for example about $1 \times 10^6/cm^2$, and the ratio of the maximum defect density to the minimum defect density is about 10 times at highest.

Accordingly, the GaN substrate 1 has an extremely excellent crystallinity in the point that the average defect density is extremely low, and in the point of having a defect density distribution in which variation of in-plane defect density is extremely low. Even in a case of a wider measurement area on the GaN substrate 1 (for example, even in a case of about 20 mm square width), about the same degree of such a low average defect density and a low variation of the in-plane defect density can be observed, and the defect density in each measurement position is for example $3 \times 10^6/cm^2$ or less at maximum. Although the average defect density of the GaN substrate 1 can be varied to some degree in each substrate (in each manufacturing lot), it is set in a range of for example about $5 \times 10^5/cm^2$ to $3 \times 10^6/cm^2$, and typically about $2 \times 10^6/cm^2$.

The inventors of the present invention consider that use of the GaN substrate 1 with extremely low average defect density and extremely low variation of the defect density, is one of the reasons for realizing the GaN multilayer structure that cannot be achieved conventionally.

More specifically, the inventors of the present invention consider it preferable to use the GaN substrate having the average defect density of for example $2 \times 10^6/cm^2$ or less and more preferable to use the GaN substrate having the average defect density of $1 \times 10^6/cm^2$ or less, and most preferable to use the GaN substrate having the average defect density of $5 \times 10^5/cm^2$ or less, as the GaN substrate 1. The inventors of the present invention also consider it preferable to use the GaN substrate having the ratio of the maximum defect density to the minimum defect density in the plane set to be 10 times or less, and consider it more preferable to use the GaN substrate having the ratio set to be 5 times or less. It can be said that the average defect density is extremely low and the variation of the defect density is extremely low, for the reason that the measured maximum defect density is suppressed to for example $3 \times 10^6/cm^2$ or less.

The GaN layer 2 is epitaxially grown on the GaN substrate 1. For example, an organic vapor phase epitaxy (MOVPE) can be used as a film formation method for forming the GaN layer 2. For example, trimethyl gallium can be used as gallium (Ga) source, and for example, ammonia can be used as nitrogen (N) source. The GaN layer 2 grows by taking over the crystallinity of the GaN substrate 1, and therefore has a low average defect density comparable to the GaN substrate 1, thus realizing the GaN layer 2 having the low variation of the defect density and having the excellent crystallinity.

In the example, for example an undoped GaN layer 2 having a thickness of 2000 nm to 3000 nm (for example a thickness of 2500 nm) was formed. However, it is found that the GaN layer of the example contains Si with a mass of about $5 \times 10^{15}/cm^3$, by secondary ion mass spectrometry (SIMS). There is a possibility that Si contained in the Ga source or a reaction tube is incorporated as an impurity. As a result, the GaN layer 2 of the example was formed as the GaN layer containing Si with a mass of about $5 \times 10^{15}/cm^3$ as n-type impurity, and having n-type conductivity in which the electron concentration was about $1 \times 10^{15}/cm^3$. It is also possible to form the GaN layer 2 as needed, as a layer positively doped with the n-type impurity, using a source containing the n-type impurity during film formation.

Figure 2:
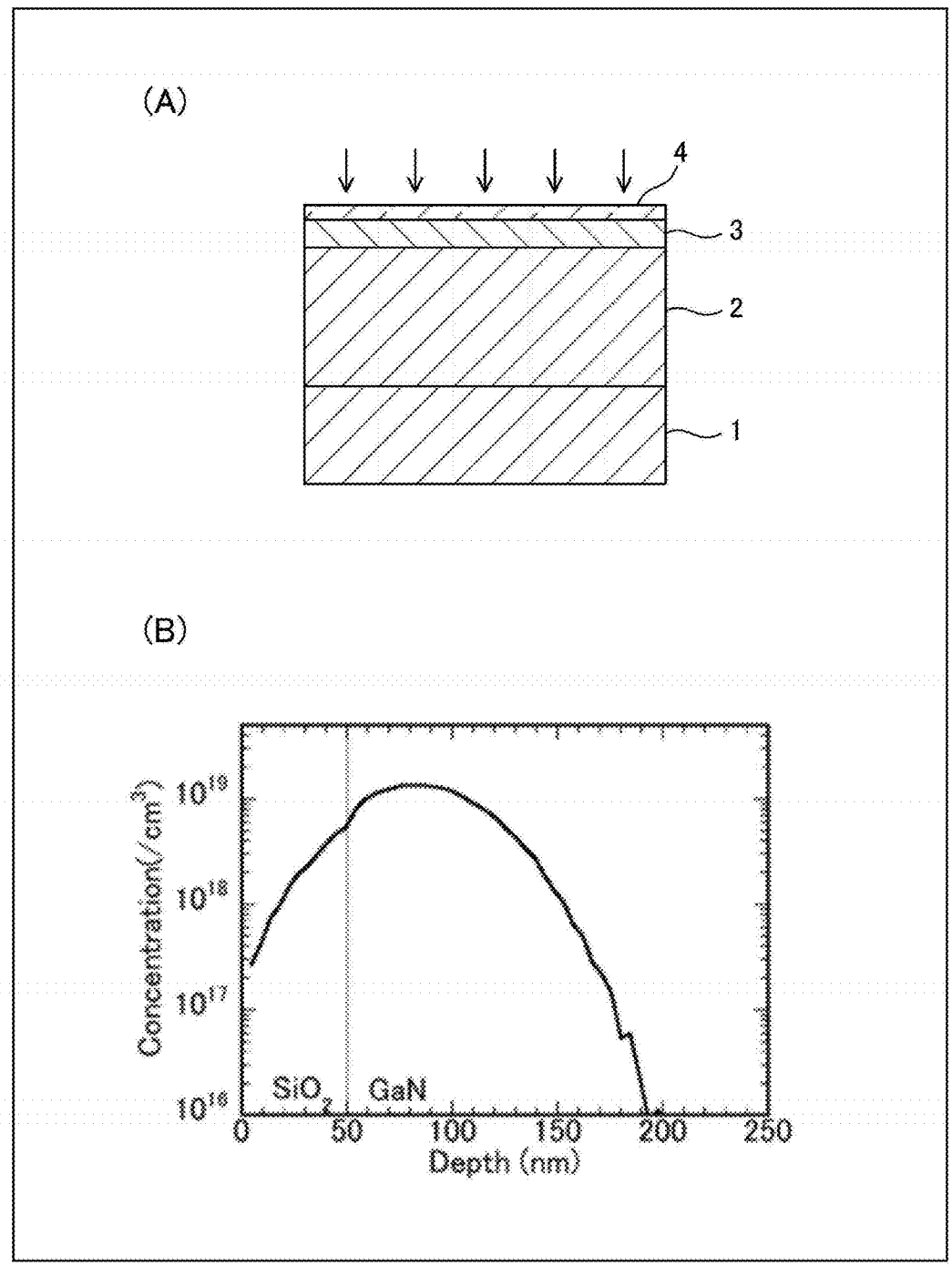
FIG. 2(A) is a schematic cross-sectional view showing the formation step of the semiconductor multilayer structure according to an embodiment.
FIG. 2(B) is a profile in a depth direction of a Mg concentration according to an example.

FIG. 2(A) is referenced. Mg ions are implanted into an upper layer portion of the GaN layer 2 as p-type impurity, to thereby form Mg-implanted GaN layer 3. An implantation protective film 4 such as a silicon oxide film or a silicon nitride film, etc., is formed on the GaN layer 2, and Mg ion implantation can be performed through the implantation protective film 4. By the ion implantation through the implantation protective film 4, a peak position of the Mg concentration can be easily close to the surface of the GaN layer 3.

In the example, a silicon oxide film having a thickness of 50 nm was deposited on the GaN layer 2 by sputtering as the implantation protective film 4. Mg ions were implanted into the GaN layer 2 through the implantation protective film 4 at an implantation energy of 60 keV, and a dose of $1.0 \times 10^{14}/cm^2$, to thereby form Mg-implanted GaN layer 3. The implantation protective film 4 was thereafter removed with hydrofluoric acid.

FIG. 2(B) is referenced. FIG. 2(B) is a profile in a depth direction of the Mg concentration according to the example, and showing a simulation result calculated by SRIM which is a simulation software for the ion implantation. Mg concentration distribution is expected to be formed, having a peak of about $1 \times 10^{19}/cm^3$ at a position of a depth 80 nm from the surface of the implantation protective film (SiO$_2$ film) 4 having a thickness of 50 nm, namely, at a position of a depth 30 nm from the surface of the GaN layer 3.

Figure 3:
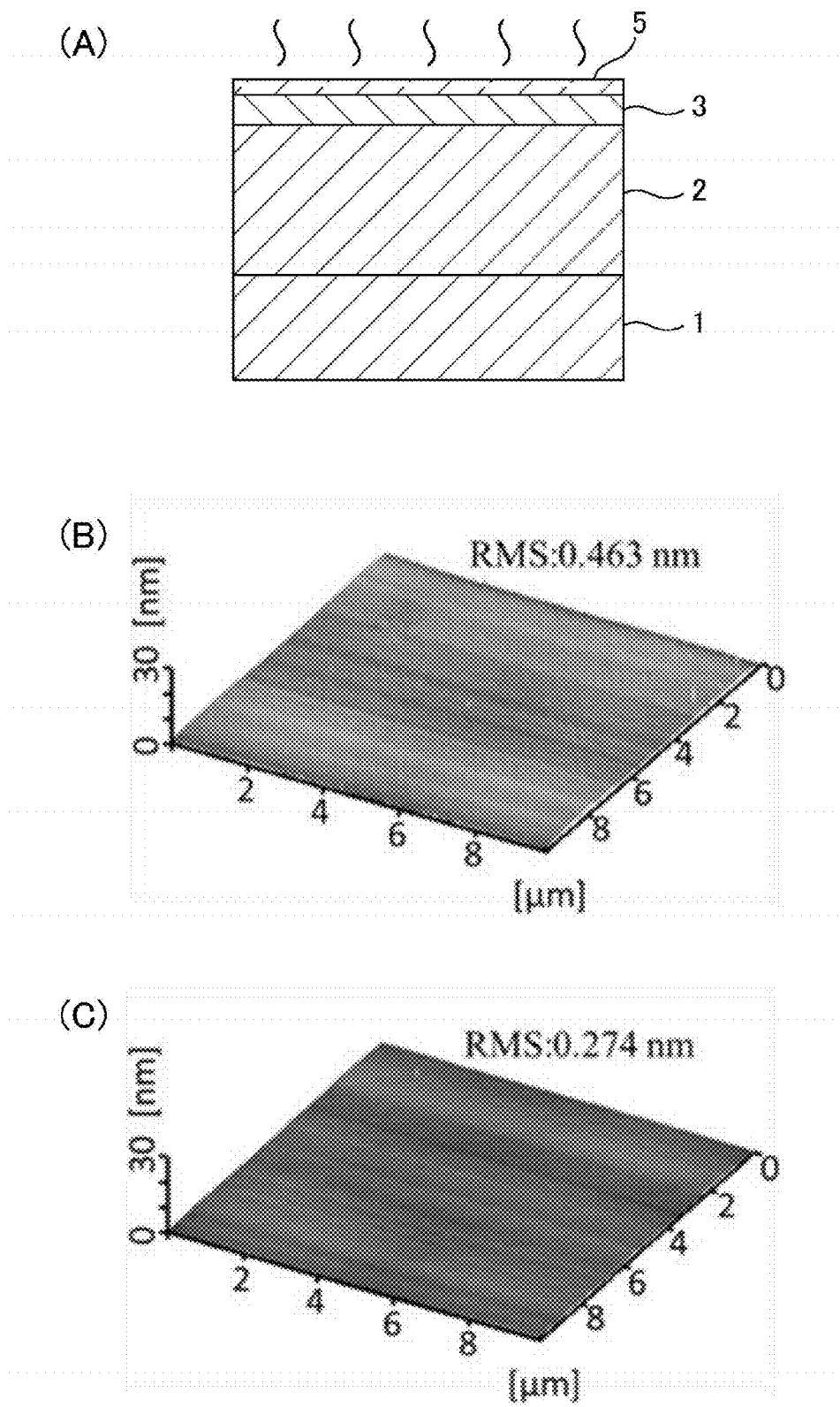
FIG. 3(A) is a schematic cross-sectional view showing the formation step of the semiconductor multilayer structure according to an embodiment.
FIG. 3(B) and FIG. 3(C) are AFM images of a surface of the Mg ion-implanted GaN layer before annealing and after annealing, according to an example.

FIG. 3(A) is referenced. After the Mg ion-implanted GaN layer 3 is formed, an impurity activation annealing is performed. The GaN layer 3 is inverted to p-type conductivity by the impurity activation annealing, and an n-type GaN layer 2 having n-type conductivity and a p-type GaN layer 3 having p-type conductivity are formed so that pn-junction is formed, to thereby form the semiconductor multilayer structure of this embodiment (multilayer structure of GaN multilayer structure in which the n-type GaN substrate 1, the n-type GaN layer 2, and the p-type GaN layer 3 are layered). The GaN substrate 1 and the epitaxially grown GaN layer 2 can be collectively regarded as the GaN layer having the abovementioned excellent crystallinity and serving as a base of the p-type GaN layer 3.

The impurity activation annealing is sometimes simply called annealing. The annealing can be performed for example, in nitrogen ($N_2$) atmosphere, at a temperature in a range of 1100° C. to 1350° C., and under a condition in which a fixed temperature is maintained for 20 seconds to 30 seconds. An annealing protective film 5 such as a silicon nitride film, etc., is formed on the GaN layer 3 for example in a thickness of 40 nm to 60 nm, and the annealing can be performed in a state in which the annealing protective film 5 is formed. Owing to the annealing protective film 5, roughness on the surface of the GaN layer 3 which is caused by a high temperature during annealing, can be prevented.

In the example, the silicon nitride film having a thickness of 50 nm was deposited on the GaN layer 3 by sputtering as the annealing protective film 5. Then, annealing was performed in $N_2$ atmosphere, in a state in which the annealing film 5 was formed. Two types of samples were prepared, with an annealing temperature varied to 1200° C. and 1230° C. The annealing protective film 5 was thereafter removed with a hydrofluoric acid solution.

FIG. 3(B) and FIG. 3(C) are referenced. FIG. 3(B) and FIG. 3(C) are atomic force microscope (AFM) images of the surface of the Mg ion-implanted GaN layer 3 of the example before annealing and after annealing. The annealing temperature for the sample shown in the figure is 1230° C. Root Mean Square roughness (RMS) of the GaN layer 3 was 0.463 nm before annealing, and 0.274 nm after annealing, and it was found that the GaN layer 3 had a high surface flatness of the same degree before/after annealing. RMS after annealing appears to be slightly smaller and the surface flatness appears to be improved. Probably this is because the same place cannot be exactly measured before/after annealing.

Figure 4:
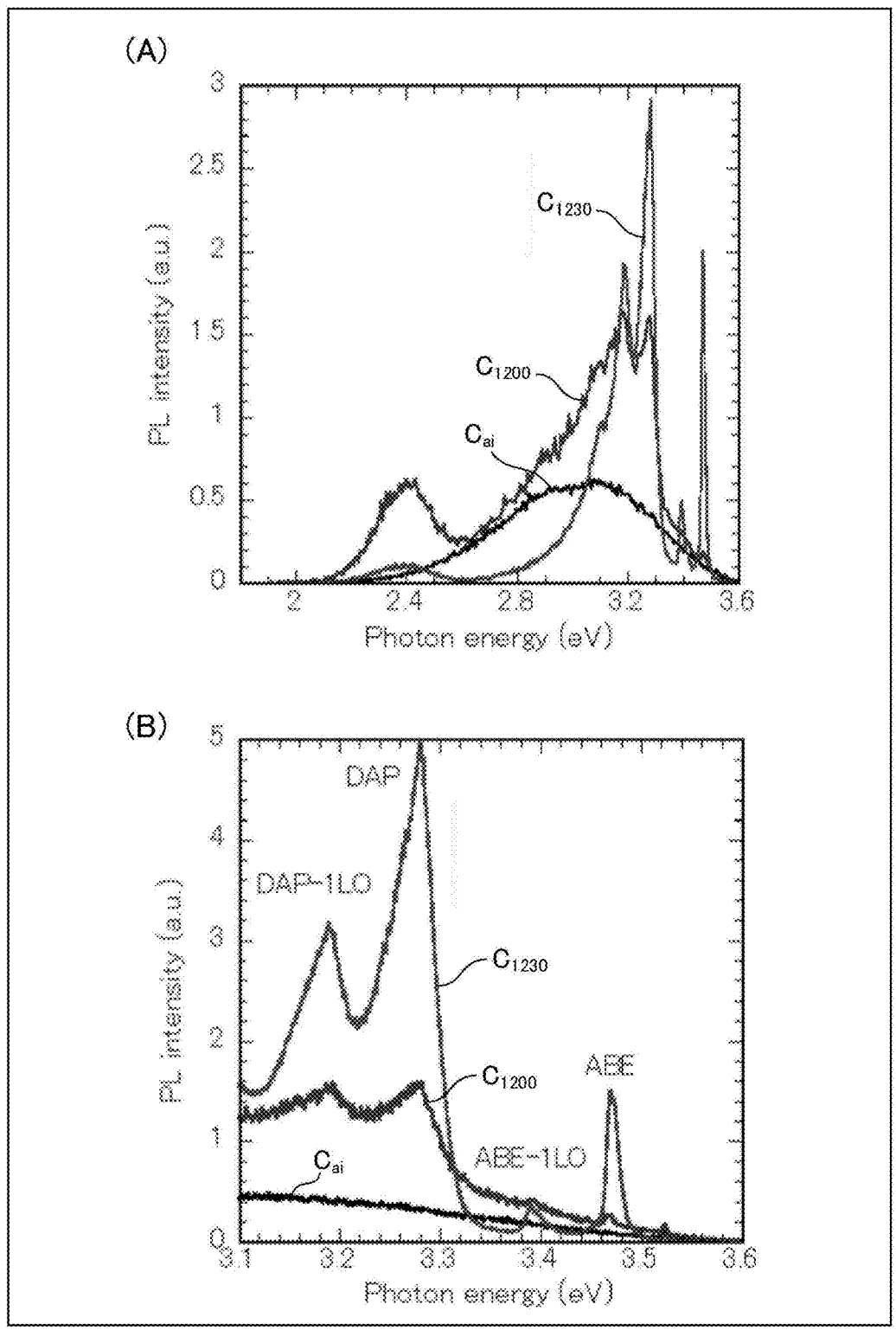
FIG. 4(A) and FIG. 4(B) are PL emission spectrums of the semiconductor multilayer structure according to an example.

FIG. 4(A) and FIG. 4(B) are referenced. FIG. 4(A) is a photoluminescence (PL) emission spectrum of a semiconductor multilayer structure according to the example, and FIG. 4(B) is a spectrum showing an enlarged portion where photon energy is 3.1 eV to 3.6 eV. In each of FIG. 4(A) and FIG. 4(B), the horizontal axis indicates the photon energy by unit of eV, and the vertical axis indicates PL emission intensity by an arbitrary unit. The PL emission spectrum was measured by irradiation of helium-cadmium (He—Cd) laser with a wavelength of 325 nm at a power of 3 mW at a temperature of 77K.

Curve $C_{ai}$ indicates the spectrum of a sample after ion implantation and before annealing (as implanted), and curve $C_{1200}$ indicates the spectrum of a sample annealed at 1200° C., and curve $C_{1230}$ indicates the spectrum of the sample annealed at 1230° C. Emission having a peak in the vicinity of 3.28 eV was observed in both of the sample annealed at 1200° C., and the sample annealed at 1230°. Such an emission is considered to be the emission caused by a donor-acceptor pair (DAP) recombination, from the value of the energy. It should be noted that regarding the sample in which Mg-doped p-type GaN layer is grown by MOVPE, the PL emission spectrum similar thereto was confirmed, and the emission is considered to be the emission caused by Mg acceptor.

In the sample annealed at 1230° C., the emission having a peak in the vicinity of 3.47 eV was clearly observed. The emission is considered to be the emission caused by acceptor bound exciton (ABE), from the value of the energy and from the shape of the peak. By raising the annealing temperature to 1230° C. from 1200° C., the defect generated by ion implantation can be recovered, and the crystallinity can be more improved. The emission peaks indicated as DAP-1LO and ABE-1LO, are considered to be caused by phonon replica of an emission by DAP re-combination and an emission caused by ABE.

Figure 5:
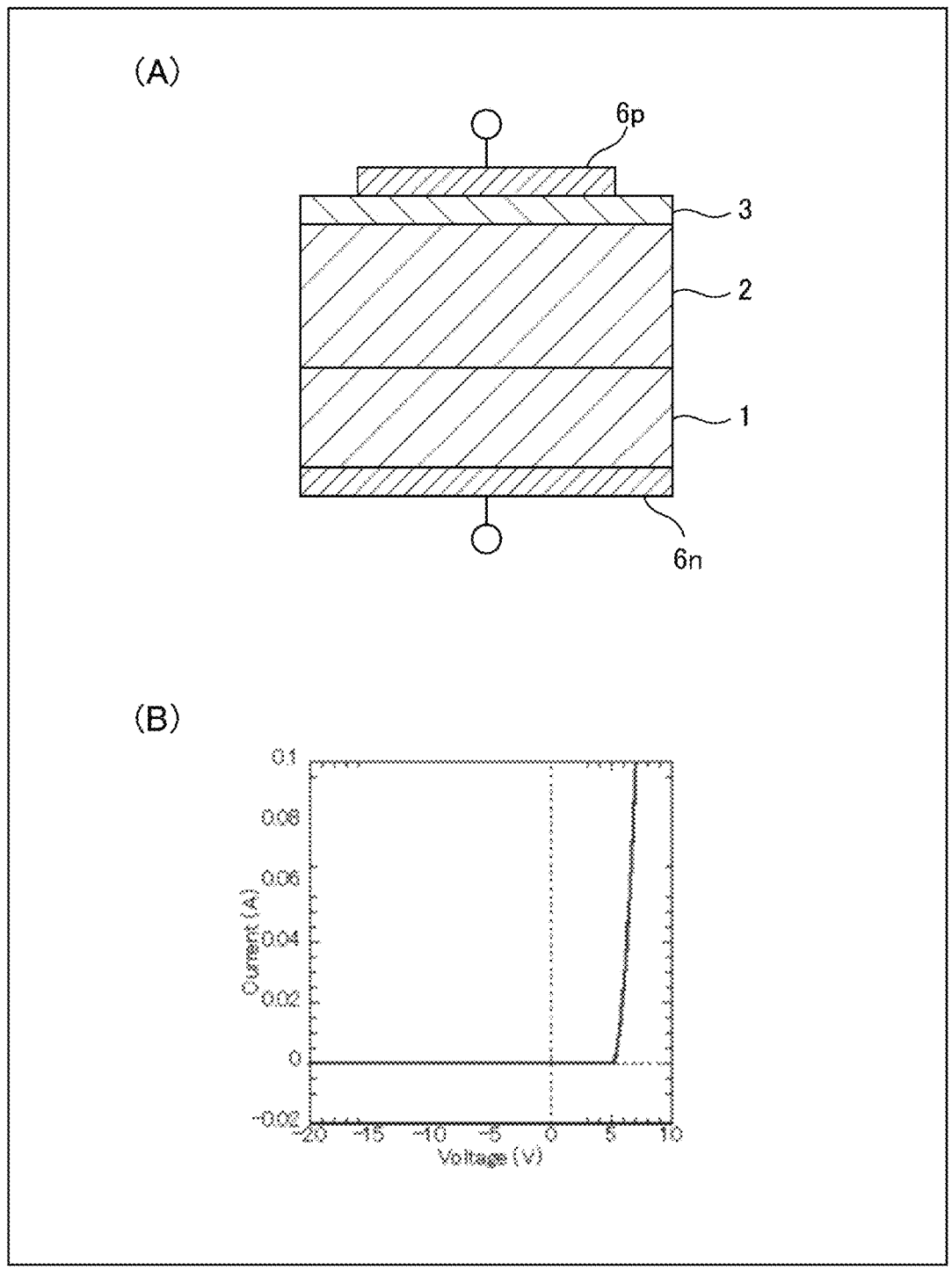
FIG. 5(A) is a schematic cross-sectional view showing the formation step of the semiconductor multilayer structure according to an embodiment.
FIG. 5(B) is a graph showing a current voltage characteristic of the semiconductor multilayer structure according to an example.

FIG. 5(A) is referenced. A p-side electrode 6p is formed on the surface of the p-type GaN layer 3, and an n-side electrode 6n is formed on the back side of the n-type GaN substrate 1. By forming the p-side electrode 6p and the n-side electrode 6n, current-voltage characteristics and EL emission characteristics of the semiconductor multilayer structure of this embodiment can be measured by applying voltage.

In the example, the p-side electrode 6p was formed by depositing a Pd layer having a thickness of 20 nm by vacuum deposition, and the n-side electrode 6n was formed by depositing a Ti layer having a thickness of 30 nm and an Al layer having a thickness of 200 nm. The n-side electrode 6n was formed on the entire surface of the back side of the n-type GaN substrate 1. On the other hand, a plurality of p-side electrodes 6p were discretely formed on the surface of the p-type GaN layer 3, to form a device structure that allows a voltage to be applied to each p-side electrode 6p. Specifically, the p-side electrodes 6p were formed, each having a diameter 3 mm, a diameter 2 mm, a diameter 400 μm, a diameter 200 μm, and a diameter 100 μm.

FIG. 5(B) is referenced. FIG. 5(B) is a graph showing current/voltage characteristics of the semiconductor multilayer structure according to the example. The annealing temperature of the sample shown here is 1230° C. This is a measurement for the device structure portion in which the p-side electrode 6p having a diameter 400 μm is formed. The horizontal axis indicates the voltage by a unit V, and the vertical axis indicates the current by a unit A. A rectifying property was observed as follows: the current rises in the vicinity of a forward bias 5V. Then, it was found that a pn-junction diode was formed. In addition, when a Hall measurement was performed, a Hall coefficient having a positive value was obtained.

Figure 6:
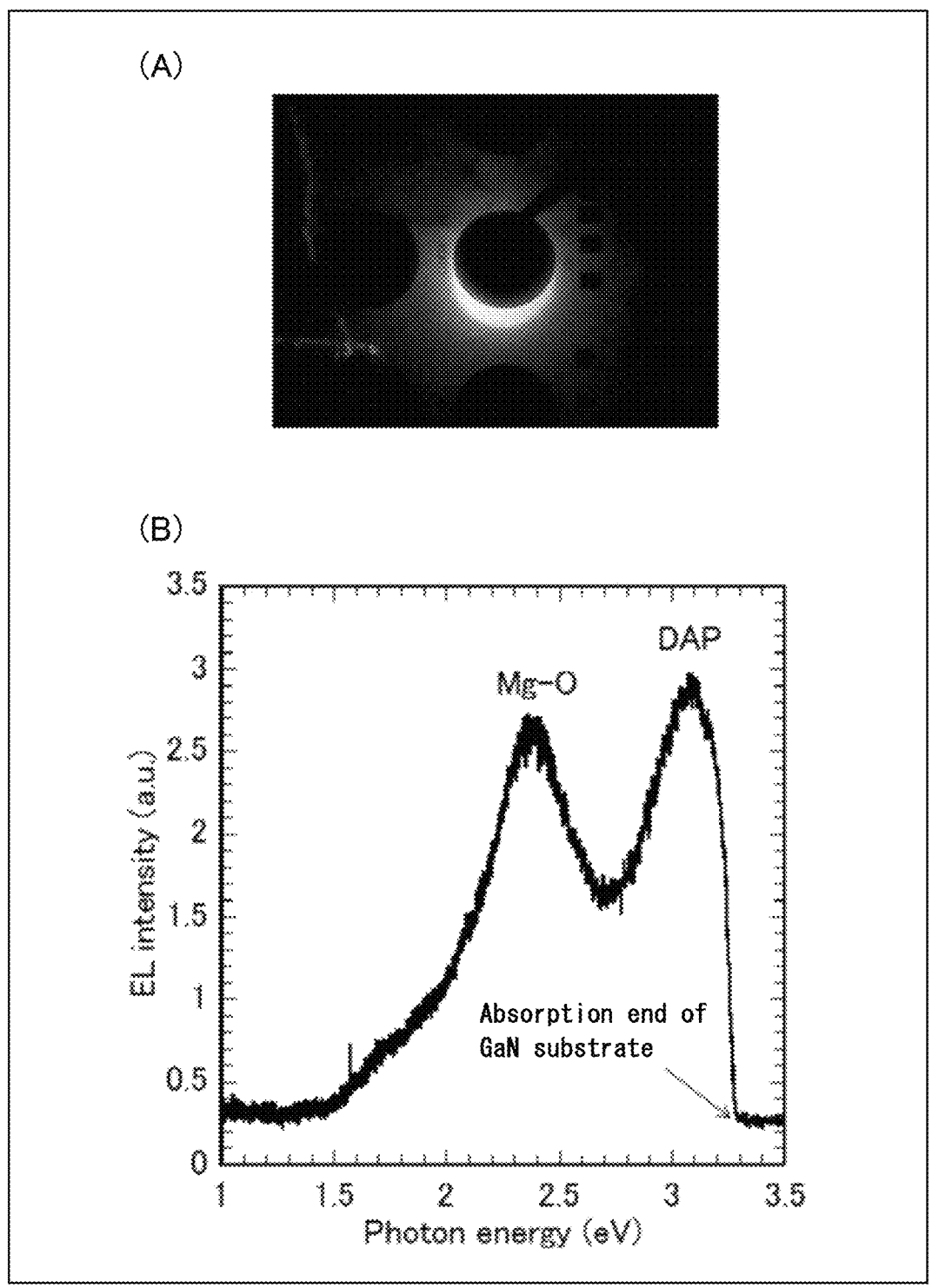
FIG. 6(A) and FIG. 6(B) are respectively a photograph showing an EL emission, and an EL emission spectrum of the semiconductor multilayer structure according to an example.

FIG. 6(A) and FIG. 6(B) are referenced. FIG. 6(A) and FIG. 6(B) are respectively a photograph and an EL emission spectrum showing an EL emission of the semiconductor multilayer structure according to the example. The annealing temperature of the sample shown in the figure is 1230° C. This is the measurement for the device structure portion in which the p-side electrode 6p having a diameter 400 μm is formed. The horizontal axis of FIG. 6(B) indicates a photon energy by a unit of eV, and the vertical axis indicates EL emission intensity by an arbitrary unit. The EL emission was observed at a room temperature, and the EL emission spectrum was measured by LabRAM HR-800 produced by Horiba which is capable of measuring a very small amount of light with a high sensitivity.

Blue-green EL emission was observed by application of the forward bias. A peak in the vicinity of 3.1 eV, and a peak in the vicinity of 2.4 eV were observed in the EL emission spectrum. The peak in the vicinity of 3.1 eV is considered to be the emission caused by recombination between a donor and Mg acceptor (DAP recombination), and a half value width (total width) is estimated to be 0.6 eV or less or 0.5 eV or less. The peak in the vicinity of 2.4 eV is considered to be caused by the emission associated with Mg acceptors and oxygen (O). These peak wavelengths correspond to ultraviolet and blue-green, and therefore a blue-green emission color was considered to be observed. The emission intensity is rapidly reduced in the vicinity of 3.3 eV, and probably this is because the light is absorbed by the GaN substrate 1.

As described above, the semiconductor multilayer structure of the example exhibits the current-voltage characteristic having the rectifying property, and exhibits the EL emission having a peak at the photon energy corresponding to DAP recombination. Thus, it can be judged that the semiconductor multilayer structure of the example has the pn-junction, and the Mg ion-implanted GaN layer 3 exhibits p-type conductivity.

The semiconductor multilayer structure according to a first comparative example and a second comparative example, will be described next.

Figure 7:
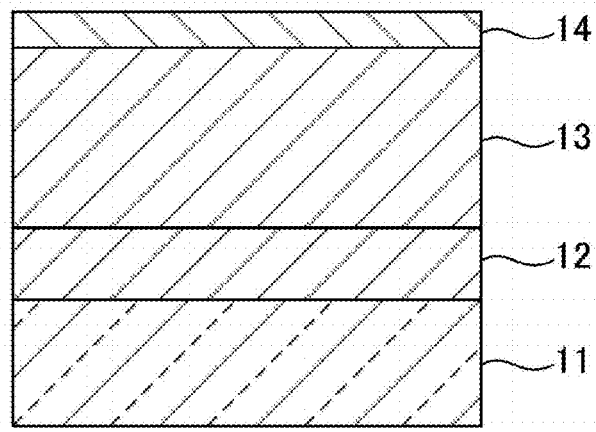
FIG. 7(A) is a schematic cross-sectional view of the semiconductor multilayer structure according to a first comparative example.
FIG. 7(B) and FIG. 7(C) are respectively an AFM image of the surface of the Mg ion-implanted GaN layer before annealing and after annealing, according to the first comparative example.
Figure 7:
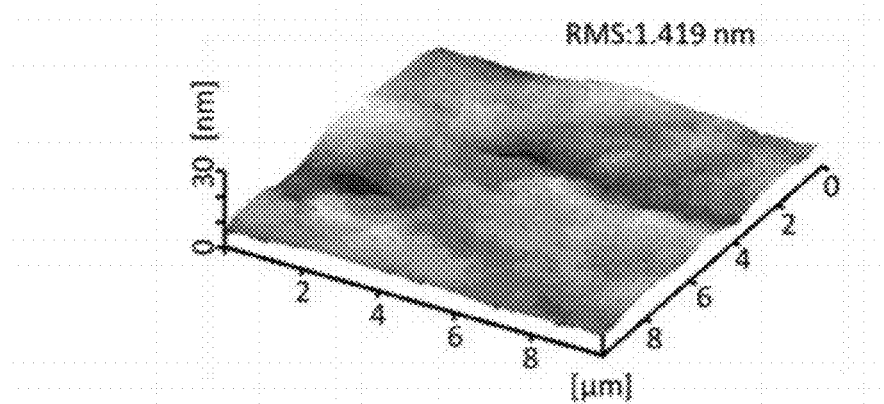
Figure 7:
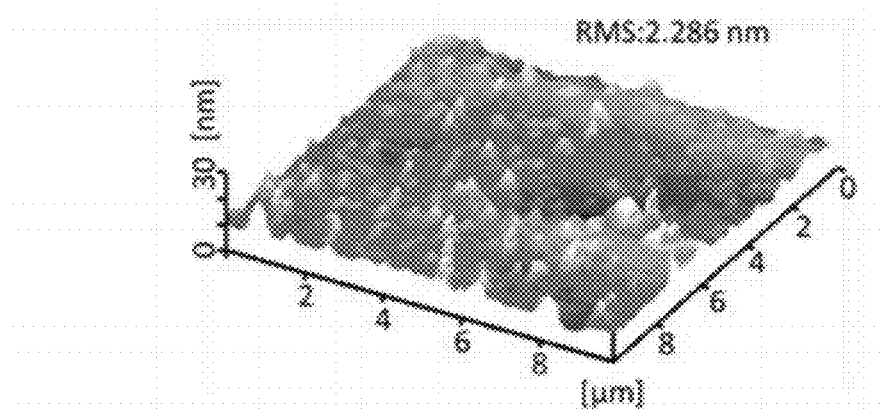

FIG. 7(A) is a schematic cross-sectional view of the semiconductor multilayer structure according to the first comparative example. Undoped GaN layer 13 having a thickness of 2000 nm, is formed on a sapphire ($Al_2O_3$) substrate 11 via a buffer layer 12. Mg ion-implanted GaN layer 14 is formed by implanting Mg ions into an upper layer of the GaN layer 13.

An impurity activation annealing was applied to the semiconductor multilayer structure of the first comparative example in which the Mg ion-implanted GaN layer 14 was formed. Two types of samples were prepared, with an annealing temperature varied to 1200° C. and 1250° C.

FIG. 7(B) and FIG. 7(C) are referenced. FIG. 7(B) and FIG. 7(C) are AFM images of the surface of the Mg ion-implanted GaN layer 14 of the first comparative example before annealing and after annealing. The annealing temperature of the sample shown in the figure is 1250° C. It was found that RMS of the GaN layer 14 was 1.419 nm before annealing, and 2.286 nm after annealing, and the surface flatness of the GaN layer 14 was deteriorated due to annealing.

Figure 8:
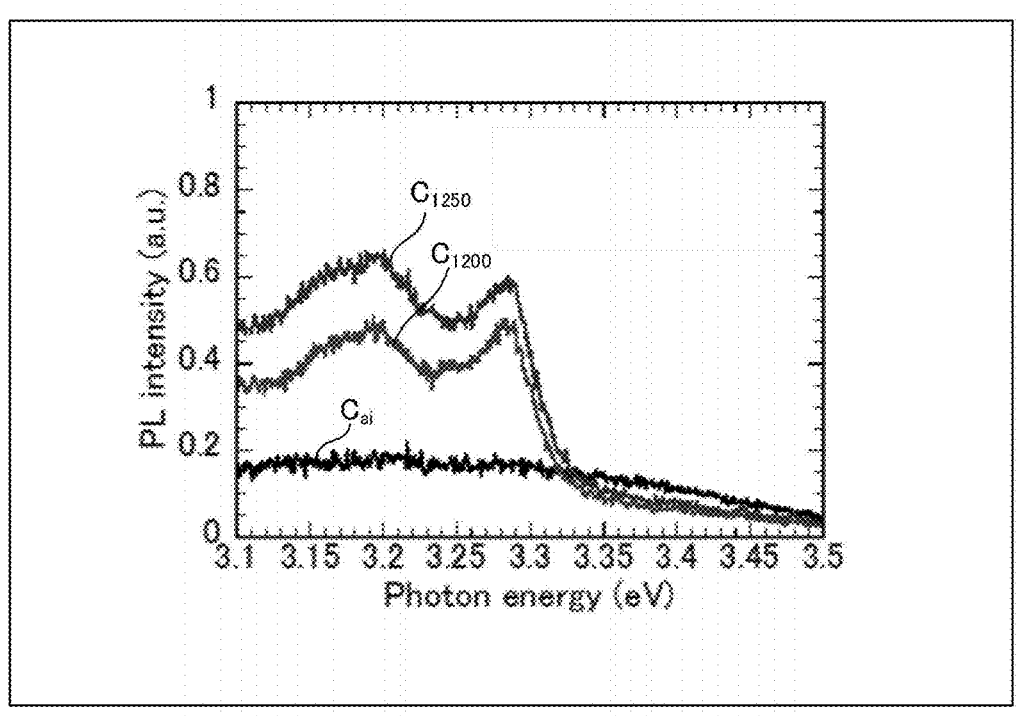
FIG. 8 is a PL emission spectrum of the semiconductor multilayer structure according to the first comparative example.

FIG. 8 is referenced. FIG. 8 is a PL emission spectrum of the semiconductor multilayer structure according to a first comparative example. The measurement temperature is 77 K. Curve $C_{ai}$ indicates a spectrum of the sample after implantation of ion and before annealing (as implanted), and curve $C_{1200}$ indicates a spectrum of the sample annealed at 1200° C., and curve $C_{1250}$ indicates a spectrum annealed at 1250° C. In the sample annealed at 1250° C. which is a higher annealing temperature, the peak of the light emitted by the acceptor bound excitons (ABE) could not be observed. This shows that a defect by ion implantation cannot be sufficiently recovered by annealing.

Thus, in the first comparative example, it is found that the surface flatness of the Mg ion-implanted GaN layer 14 is deteriorated, and the defect due to ion implantation cannot be recovered. The Mg ion-implanted GaN layer 14 after annealing was a considerably high resistance layer.

In the first comparative example, the GaN layer 13 is epitaxially grown on the sapphire substrate 11 which is a heterogeneous substrate. Therefore, it is difficult to improve the crystallinity of the GaN layer 13. For example, a defect density of the GaN layer 13 is $1 \times 10^8/cm^2$ or more order. Due to this fact, it is considered that formation of the p-type GaN layer by Mg ion implantation is difficult.

Figure 9:
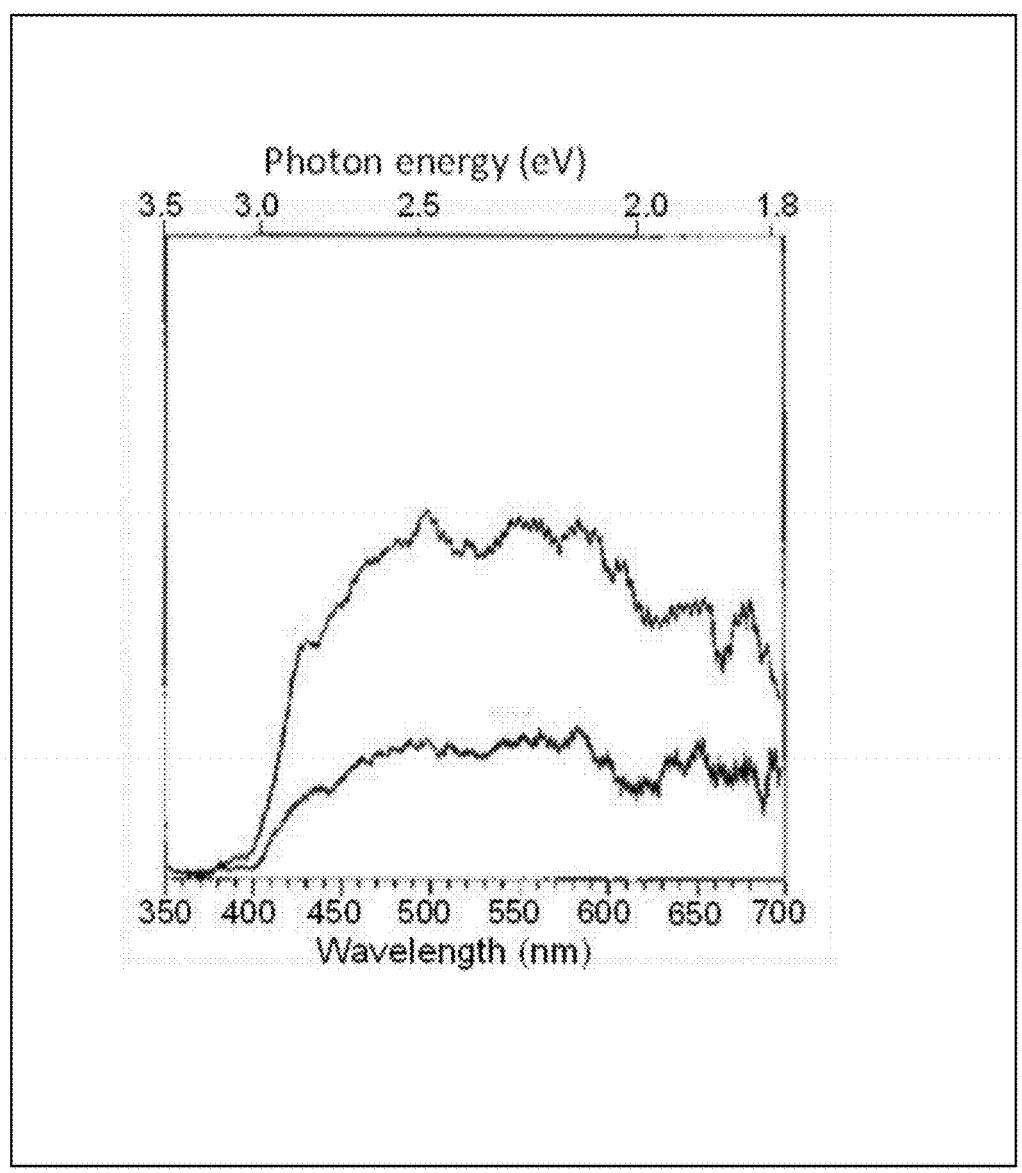
FIG. 9 is an EL emission spectrum of the semiconductor multilayer structure according to a second comparative example.

FIG. 9 is an EL emission spectrum of the semiconductor multilayer structure according to a second comparative example. The EL emission spectrum is described in E. V. Kalinina et al., Electrical and optical properties of Mg ion implanted GaN pn-junctions, HITEN 99. (non-patent document 1). In this document, attempt to form the p-type GaN layer is carried out by implanting Mg ions into the GaN layer formed on silicon carbide (SiC) substrate which is a heterogeneous substrate.

The spectrum of FIG. 9 is broad, and the emission color is white. In the spectrum of FIG. 9, the peak by the emission due to Mg acceptor, cannot be observed.

According to the first comparative example and the second comparative example, it would be difficult to form the excellent p-type GaN layer by implanting Mg ions into the GaN layer grown on the heterogeneous substrate. In forming the excellent p-type GaN layer by implanting Mg ions, it is preferable to use at least a freestanding substrate of a single crystal GaN, for growing the GaN layer in which Mg is ion-implanted, with good crystallinity.

As described above, in the test described as the example, the inventors of the present invention achieve the GaN multilayer structure having the pn-junction formed by the n-type GaN layer and the Mg ion-implanted p-type GaN layer, and exhibiting EL emission having the peak at the photon energy slightly lower than about 3.4 eV of the bandgap energy of GaN, for example, the photon energy of 3.0 eV or more, by growing the epitaxially grown GaN layer with extremely good crystallinity as the base of the Mg ion-implanted GaN layer, using the single crystal GaN freestanding substrate having extremely good crystallinity.

In the abovementioned example, in order to confirm the formation of the p-type GaN layer by Mg ion implantation, the light-emitting diode was formed, and the EL emission was observed. However, the application of the p-type GaN layer by Mg ion implantation, is not limited to the light emitting diode, and can be applied to a transistor such as a power transistor, etc., for example.

In recent years, semiconductor devices such as light emitting diodes have a tendency to increase the size thereof, and it is desired to form a 0.5 cm square or more or 1 cm square or more large-sized device. The GaN substrate 1 described in this embodiment has a small variation of a defect density in the plane, and therefore has an advantage that it is suitable for forming the large-sized device (for example, having a size of 1 mm square or more). When a defect density variation is large in the plane, and there is an area where the defect density is extremely high, it is difficult to improve a performance of the device as a whole. For example, emission efficiency is reduced, or reverse breakdown voltage is lowered.

As described above, the present invention has been described based on examples. However, the present invention is not limited thereto, and for example, it is obvious for a skilled person that various modifications, improvement, and combinations, etc., are acceptable.

DESCRIPTION OF SIGNS AND NUMERALS

1 GaN substrate
2 Epitaxial growth GaN layer, n-type GaN layer
3 Mg ion-implanted GaN layer, p-type GaN layer
4 Implanted protective film 5 Annealing protective film
6*p* p-side electrode
6*n* n-side electrode

The invention claimed is:

1. A semiconductor multilayer structure, comprising:
a n-type GaN layer having a ratio of a maximum defect density to a minimum defect density in a plane of 10 times or less and an average defect density of $1\times10^6/\text{cm}^2$ or less; and
a p-type GaN layer which is formed on the n-type GaN layer and into which Mg is ion-implanted,
and generating an electroluminescence emission having a peak at a photon energy of 3.0 eV or more, by applying a voltage to a pn-junction formed by the n-type GaN layer and the p-type GaN layer.

2. The semiconductor multilayer structure according to claim 1, wherein the n-type GaN layer has a measured maximum defect density of $3\times10^6/\text{cm}^2$ or less.

3. The semiconductor multilayer structure according to claim 1, wherein in the n-type GaN layer, a ratio of a maximum defect density to a minimum defect density in a plane, is 5 times or less.

4. The semiconductor multilayer structure according to claim 1, wherein in the n-type GaN layer, an average defect density is $5\times10^5/\text{cm}^2$ or less.

5. A semiconductor multilayer structure, comprising:
a n-type GaN layer having a ratio of a maximum defect density to a minimum defect density in a plane of 10 times or less and an average defect density of $1\times10^6/\text{cm}^2$ or less; and
a p-type GaN layer which is formed on the n-type GaN layer and into which Mg is ion-implanted.

6. The semiconductor multilayer structure according to claim 5, wherein in the n-type GaN layer, a ratio of the maximum defect density to the minimum defect density in the plane is 5 times or less.

7. The semiconductor multilayer structure according to claim 5, wherein in the n-type GaN layer, an average defect density is $5\times10^5/\text{cm}^2$ or less.

8. A method of manufacturing a semiconductor multilayer structure, comprising:
epitaxially growing a GaN layer on a n-type GaN substrate having a ratio of a maximum defect density to a minimum defect density in a plane of 10 times or less and an average defect density of $1\times10^6/\text{cm}^2$ or less;
implanting Mg ions into the GaN layer; and
applying annealing to the GaN layer after implanting the Mg ions.

9. The method of manufacturing a semiconductor multilayer structure according to claim 8, wherein in the n-type GaN layer, a ratio of a maximum defect density to a minimum defect density in the plane, is 5 times or less.

10. The method of manufacturing a semiconductor multilayer structure according to claim 8, wherein in the n-type GaN layer, an average defect density is $5\times10^5/\text{cm}^2$ or less.

11. The semiconductor multilayer structure according to claim 5, wherein in the n-type GaN layer, a measured maximum defect density is $3\times10^6/\text{cm}^2$ or less.

12. The semiconductor multilayer structure according to claim 8, wherein in the n-type GaN layer, a measured maximum defect density is $3\times10^6/\text{cm}^2$ or less.

* * * * *